United States Patent
Chang et al.

(10) Patent No.: US 8,611,131 B2
(45) Date of Patent: *Dec. 17, 2013

(54) VARIABLE RESISTANCE DEVICE, SEMICONDUCTOR DEVICE INCLUDING THE VARIABLE RESISTANCE DEVICE, AND METHOD OF OPERATING THE SEMICONDUCTOR DEVICE

(75) Inventors: Man Chang, Seongnam-si (KR); Young-bae Kim, Seoul (KR); Chang-jung Kim, Yongin-si (KR); Myoung-jae Lee, Hwaseong-si (KR); Seong-jun Park, Seoul (KR); Ji-hyun Hur, Hwaseong-si (KR); Dong-soo Lee, Gunpo-si (KR); Chang-bum Lee, Seoul (KR); Seung-ryul Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 85 days.

This patent is subject to a terminal disclaimer.

(21) Appl. No.: 13/307,672

(22) Filed: Nov. 30, 2011

(65) Prior Publication Data

US 2012/0230080 A1 Sep. 13, 2012

(30) Foreign Application Priority Data

Mar. 11, 2011 (KR) ........................ 10-2011-0021869

(51) Int. Cl.
*G11C 11/00* (2006.01)
*G11C 11/36* (2006.01)

(52) U.S. Cl.
USPC ............................ 365/148; 365/163; 365/175

(58) Field of Classification Search
USPC ......................................... 365/148, 163, 175
See application file for complete search history.

(56) References Cited

U.S. PATENT DOCUMENTS

| | | | |
|---|---|---|---|
| 7,609,544 B2 | 10/2009 | Osada et al. | |
| 7,639,522 B2 | 12/2009 | Cho et al. | |
| 7,646,632 B2 | 1/2010 | Philipp et al. | |
| 7,978,499 B2 | 7/2011 | Hosono et al. | |
| 8,134,866 B2 * | 3/2012 | Bae et al. | 365/163 |
| 8,213,213 B2 * | 7/2012 | Chang et al. | 365/148 |
| 8,243,542 B2 * | 8/2012 | Bae et al. | 365/163 |
| 8,320,171 B2 * | 11/2012 | Park | 365/163 |
| 8,351,240 B2 * | 1/2013 | Park et al. | 365/163 |
| 2008/0043513 A1 | 2/2008 | Hoenigschmid et al. | |
| 2008/0062740 A1 | 3/2008 | Baek et al. | |
| 2010/0188885 A1 | 7/2010 | Toda et al. | |
| 2011/0051508 A1 | 3/2011 | Eleftheriou et al. | |

FOREIGN PATENT DOCUMENTS

| | | |
|---|---|---|
| JP | 2006155700 A | 6/2006 |
| JP | 2009-026364 | 2/2009 |
| JP | 2010-092568 | 4/2010 |
| KR | 20050118331 A | 12/2005 |
| KR | 100755409 B1 | 8/2007 |
| KR | 10-0801082 | 2/2008 |
| KR | 20080085597 A | 9/2008 |

* cited by examiner

*Primary Examiner* — Trong Phan
(74) *Attorney, Agent, or Firm* — Harness, Dickey & Pierce, P.L.C.

(57) ABSTRACT

According to an example embodiment, a method of operating a semiconductor device includes applying a first voltage to the variable resistance device so as to change a resistance value of the variable resistance device from a first resistance value to a second resistance value that is different from the first resistance value, sensing first current flowing through the variable resistance device to which the first voltage is applied, determining a second voltage used to change the resistance value of the variable resistance device from the second resistance value to the first resistance value based on a distribution of the sensed first current, and applying the determined second voltage to the variable resistance device.

30 Claims, 11 Drawing Sheets

VARIABLE RESISTANCE DEVICE, SEMICONDUCTOR DEVICE INCLUDING THE VARIABLE RESISTANCE DEVICE, AND METHOD OF OPERATING THE SEMICONDUCTOR DEVICE

CROSS-REFERENCE TO RELATED APPLICATIONS

This application claims foreign priority under 35 U.S.C. §119 to the benefit of Korean Patent Application No. 10-2011-0021869, filed on Mar. 11, 2011, in the Korean Intellectual Property Office, the disclosure of which is incorporated herein in its entirety by reference.

BACKGROUND

1. Field

Some example embodiments relate to semiconductor devices, and more particularly, to a variable resistance device, a semiconductor device including the variable resistance device, and/or a method of operating the semiconductor device.

2. Description of the Related Art

As a need for memory devices that have high storage capacity and low power consumption increases, more research is being conducted into next-generation memory devices that are not only non-volatile but also do not need to be refreshed. Such a next-generation memory device is desired to have high integration characteristics of Dynamic Random Access Memory (DRAM), non-volatile characteristics of flash memory, high-speed operating characteristics of Static RAM (SRAM), and so on. Next-generation memory devices may include Phase change RAM (PRAM), Nano Floating Gate Memory (NFGM), Polymer RAM (PoRAM), Magnetic RAM (MRAM), Ferroelectric RAM (FeRAM), and Resistive RAM (RRAM). From among the above next-generation memory devices, RRAM is based on the phenomenon that a path in which current flows is generated thus lowering electrical resistance when a sufficiently high current is applied to a nonconductive material. In this case, once the path is generated, the path may be canceled or regenerated by applying an adequate voltage to the nonconductive material.

SUMMARY

Some example embodiments relate to a variable resistance device, the dispersion of off current of which is improved so as to increase the reliability of a semiconductor device including the variable resistance device, the semiconductor device, and/or a method of operating the semiconductor device.

According to an example embodiment, a method of operating a semiconductor device including a variable resistance device, includes applying a first voltage to the variable resistance device to change a resistance value of the variable resistance device from a first resistance value to a second resistance value that is different from the first resistance value, sensing first current flowing through the variable resistance device to which the first voltage is applied, determining a second voltage used to change the resistance value of the variable resistance device from the second resistance value to the first resistance value based on a distribution of the sensed first current, and applying the determined second voltage to the variable resistance device.

The second resistance value may be greater than the first resistance value.

The determining of the second voltage may include comparing the distribution of the first current with an average level of the first current.

The determining of the second voltage may further include changing the second voltage if a difference between a sensed level of the first current and the average level of the first current is greater than a first threshold amount, and maintaining the second voltage if the difference between a sensed level of the first current and the average level of the first current is smaller than or equal to the first threshold amount.

The changing of the second voltage may include changing the second voltage to a third voltage that is greater than the second voltage if the sensed level of the first current is smaller than the average level of the first current, and changing the second voltage to a fourth voltage that is smaller than the second voltage if the sensed level of the first current is greater than the average level of the first current.

The changing of the second voltage may include changing at least one of a magnitude and a pulse width of the second voltage.

The determining of the second voltage may further include changing the second voltage if the sensed level of the first current is different from the average level of the first current, and maintaining the second voltage if the sensed level of the first current is equal to the average level of the first current.

The changing of the second voltage may include changing the second voltage to the third voltage that is greater than the second voltage if the sensed level of the first current is smaller than the average level of the first current, and changing the second voltage to the fourth voltage that is smaller than the second voltage if the sensed level of the first current is greater than the average level of the first current.

The changing of the second voltage may include changing at least one of the magnitude and the pulse width of the second voltage.

The determining of the second voltage may further include determining the second voltage so that the greater the distribution of the first current, the greater the variation of the second voltage.

The sensing of the first current may include sensing the first current flowing through the variable resistance device to which the first voltage is applied by applying a read voltage having an absolute value smaller than that of the first voltage.

The method may further include sensing a second current flowing through the variable resistance device to which the second voltage is applied.

The sensing of the second current may include sensing the second current flowing through the variable resistance device to which the second voltage is applied. The sensing of the second current my include applying a read voltage having an absolute value smaller than that of the second voltage to the variable resistance device.

The semiconductor device may include a multi-bit non-volatile memory device.

The first resistance may be a set resistance, and the second resistance may be a reset resistance.

The variable resistance device may include a variable resistance material layer including one of a perovskite material and a transition metal oxide.

The variable resistance device may include a lower electrode, an upper electrode, and a variable resistance material layer between the lower electrode and the upper electrode. At least one of the lower electrode and the upper electrode may include one of an oxidation resistance metal layer and a polysilicon layer.

The first voltage may be a reset voltage for changing the variable resistance device to a high resistance state, and the second voltage may be a set voltage for changing the variable resistance device a low resistance state. The reset voltage may be about 4.5V.

The semiconductor device may include a single-bit non-volatile memory device.

According to another example embodiment, a variable resistance device may include a first electrode and a second electrode, a variable resistance material layer between the first and second electrodes, and a control circuit operatively connected to the variable resistance material layer. The control circuit may be configured to change a resistance value of the variable resistance material layer from a first resistance value to a second resistance value greater than the first resistance value by causing the application of a first voltage between the first and second electrodes. The control circuit may be configured to change the resistance value of the variable resistance material layer from the second resistance value to the first resistance value by causing the application of a second voltage between the first and second electrodes. The control circuit may be configured to determine the second voltage based on a distribution of a first current flowing through the variable resistance device.

The control circuit may be configured to change the second voltage if a difference between a sensed level of the first current and an average level of the first current is greater than a first threshold amount, and the control circuit may be configured to maintain the second voltage if the difference between a sensed level of the first current and the average level of the first current is smaller than or equal to the first threshold amount.

The control circuit may be configured to change the second voltage if the sensed level of the first current and the average level of the first current are different from each other, the control circuit may be configured to maintain the second voltage if the sensed level of the first current and the average level of the first current are the same.

According to another example embodiment, a semiconductor device may include a variable resistance device. The variable resistance device may include a first electrode and a second electrode, a variable resistance material layer between the first and the second electrode, and a control circuit operatively connected to the variable resistance material layers. the control circuit may be configured to change a resistance value of the variable resistance material layer from a first resistance value to a second resistance value that is greater than the first resistance value by causing the application of a first voltage between the first and second electrode. The control circuit may be configured to change the resistance value of the variable resistance material layer from the second resistance value to the first resistance value by causing the application of a second voltage between the first and second electrodes. The control circuit may be configured to determine the second voltage based on a distribution of a first current flowing through the variable resistance device.

The control circuit may be configured to change the second voltage if a difference between a sensed level of the first current and the average level of the first current is greater than a first threshold amount. The control circuit may be configured to maintain the second voltage if the difference between a sensed level of the first current and the average level of the first current is smaller than or equal to the first threshold amount.

The control circuit may be configured to change the second voltage if the sensed level of the first current and the average level of the first current are different from each other. The control circuit may be configured to maintain the second voltage if the sensed level of the first current and the average level of the first current are the same.

The variable resistance material layer may include on of a perovskite material and a transition metal oxide.

According to an example embodiment, a memory card may include the foregoing semiconductor device and a controller operatively connected to the semiconductor device.

According to an example embodiment, an electronic system may include the foregoing semiconductor device, a process, and a bus that operatively connects the semiconductor device to the processor.

BRIEF DESCRIPTION OF THE DRAWINGS

The foregoing and/or other features and advantages of example embodiments will become apparent and more readily appreciated from the following description of non-limiting embodiments, as illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
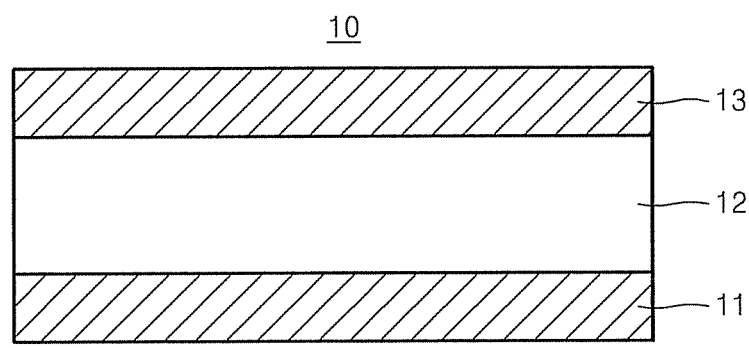
FIG. 1 is a schematic cross-sectional view of a variable resistance device according to an example embodiment.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, 'at least one' means one or more and thus may include individual components as well as mixtures/combinations.

FIG. 1 is a schematic cross-sectional view of a variable resistance device 10 according to an example embodiment. Referring to FIG. 1, the variable resistance device 10 may include a lower electrode 11, a variable resistance material layer 12, and an upper electrode 13. The variable resistance material layer 12 may be formed between the lower electrode 11 and the upper electrode 13. In another example embodiment, the variable resistance device 10 may further include a buffer layer (not shown) on the lower electrode 11 and/or on the variable resistance material layer 12.

The lower electrode 11 and the upper electrode 13 may be formed of a conductive material, for example, an oxidation resistant metal layer or a polysilicon layer. For example, the oxidation resistant metal layer may be formed of at least one of iridium (Ir), platinum (Pt), an iridium oxide (IrO), a titanium nitride (TiN), a titanium aluminum nitride (TiAlN), tungsten (W), molybdenum (Mo), ruthenium (Ru), and a ruthenium oxide (RuO). The oxidation resistant metal layer may be formed after the buffer layer is formed. The lower electrode 11 and the upper electrode 13 may be located on and below the variable resistance material layer 12, respectively, but example embodiments are not limited thereto. In another example embodiment, the lower electrode 11 and the upper electrode 13 may be located to the left and right sides of the variable resistance material layer 12, respectively.

The variable resistance material layer 12 may include a perovskite-based oxide or a transition metal oxide, but example embodiments are not limited thereto. Examples of the perovskite-based oxide include $Pr_{1-x}Ca_xMnO_3$, $La_{1-x}Ca_xMnO_3$, $SrZrO_3/SrTiO_3$, $CrTiO_3$, $Pb(Zr, Ti)O_3/Zn_{1-x}Cd_xS$, and so on. Examples of the transition metal oxide include oxides of nickel, niobium, titanium, zirconium, hafnium, cobalt, iron, copper, manganese, zinc, chrome, tantalum, and so on. A resistance value of the variable resistance material layer 12 may vary according to the difference between voltages applied to the lower electrode 11 and the upper electrode 13.

Figure 2:
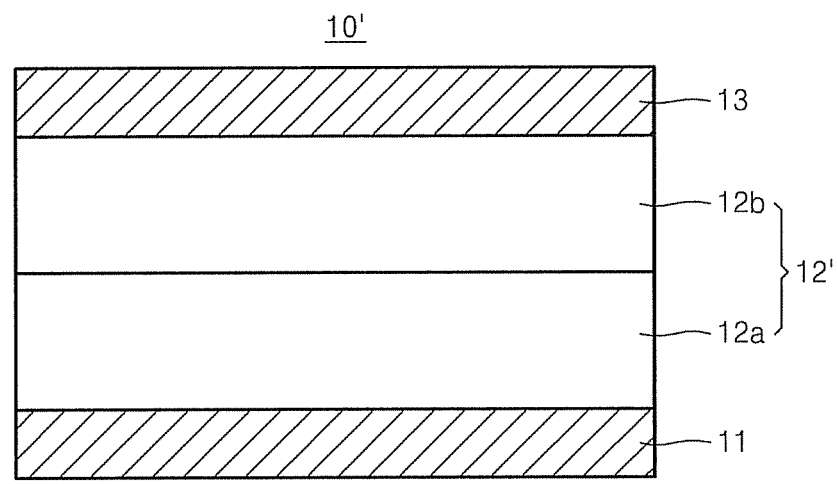
FIG. 2 is a schematic cross-sectional view of a variable resistance device according to another example embodiment.

FIG. 2 is a schematic cross-sectional view of a variable resistance device 10' according to another example embodiment. Referring to FIG. 2, the variable resistance device 10' may include a lower electrode 11, a variable resistance material layer 12', and an upper electrode 13. The variable resistance material layer 12' may be formed between the lower electrode 11 and the upper electrode 13. The variable resistance material layer 12' may include a base thin film 12a and an oxygen exchange layer 12b. For example, the base thin film 12a may include a $TaO_x$ layer, and the oxygen exchange layer 12b may include a $Ta_2O_5$ layer, but example embodiments are not limited thereto. The variable resistance device 10' is a modified example embodiment of the variable resistance device 10 illustrated in FIG. 1, and the variable resistance device 10 shown in FIG. 1 may also be modified to incorporate features of the variable resistance device 10' shown in FIG. 2.

Figure 3:
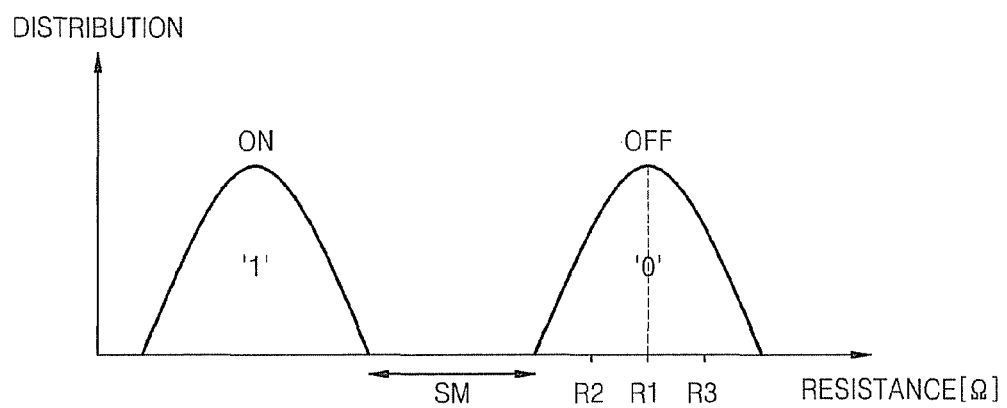
FIG. 3 is a graph schematically illustrating a distribution of resistance values of a variable resistance device, according to an example embodiment.

FIG. 3 is a graph schematically illustrating a distribution of resistance values of a variable resistance device, according to an example embodiment.

Referring to FIG. 3, the X-axis denotes a resistance value of the variable resistance device, and the Y-axis denotes the total number of variable resistance devices. The variable resistance device may include the variable resistance device 10 of FIG. 1 and/or the variable resistance device 10' of FIG. 2. For descriptive convenience, the variable resistance device includes the variable resistance device 10 of FIG. 1.

The variable resistance device 10 may be used in a semiconductor device, such as a single-bit non-volatile memory device, which memorizes data '0' or '1' according to the resistance state of the variable resistance material layer 12. The variable resistance device 10 may be used in a semiconductor device, such as a multi-bit non-volatile memory device, which memorizes data '00', '01','10', or '11' according to the resistance state of the variable resistance material layer 12.

In FIG. 3, data '0' and data '1' may denote a high resistance state and a low resistance state. Writing data '1' to the variable resistance device may be referred to as a set operation, and writing data '0' to the variable resistance device may be referred to as a reset operation. However, example embodiments are not limited thereto, and according to another example embodiment, data '1' and data '0' may correspond to a high resistance state and a low resistance state.

The variable resistance device 10 may be 'on' when data '1' is written thereto, and may be 'off' when data '0' is written thereto. In this case, in order to improve the reliability of the variable resistance device 10 (or a semiconductor device including the variable resistance device 10), a sufficient sensing margin SM between the 'on' state and the 'off' state of the variable resistance device 10 should be secured.

When the variable resistance device 10 is in an 'off' state, that is, when the variable resistance device 10 is in the high resistance state, a resistance of the variable resistance device 10 may be an off resistance $R_{OFF}$ that may be divided into first through third resistances R1, R2, and R3. In this regard, the first resistance R1 may correspond to an average value of the off resistance $R_{OFF}$, the second resistance R2 may correspond to a resistance value smaller than the average value of the off resistance $R_{OFF}$, and the third resistance R3 may correspond to a resistance value greater than the average value of the off resistance $R_{OFF}$. The off resistance $R_{OFF}$ of the variable resistance device 10 may have a desired (or alternatively predetermined) distribution.

When the variable resistance device 10 is switched from an "off" state to the "on" state, a conductive path is formed in the variable resistance material layer 12 between the lower electrode 11 and the upper electrode 13. In this regard, the energy necessary for changing the variable resistance device 10 from the "on" state to the "off" state may vary according to the characteristics of the conductive path formed when the variable resistance device 10 is in the "on" state, for example, sizes, number, or lengths of components.

More specifically, when a size of the conductive path formed when the variable resistance device 10 is in the "on" state is relatively small, the energy necessary for changing the variable resistance device 10 from the "on" state to the "off" state may be relatively small. Meanwhile, when the size of the conductive path formed when the variable resistance device 10 is in the "on" state is relatively large, the energy necessary for changing the variable resistance device 10 from the "on" state to the "off" state may be relatively large.

Figure 4:
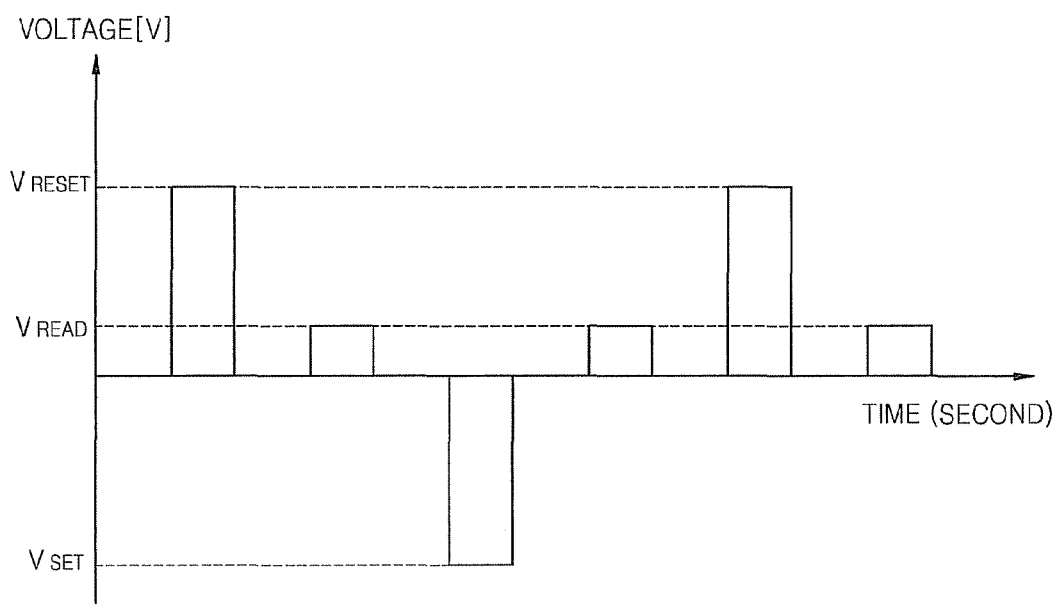
FIG. 4 is a graph showing operating voltages applied to a variable resistance device, according to an example embodiment.

FIG. 4 is a graph showing operating voltages applied to a variable resistance device, according to an example embodiment.

Referring to FIG. 4, the X-axis denotes time (seconds) and the Y-axis denotes a voltage (V) applied to the variable resistance device 10. The variable resistance device may include the variable resistance device 10 of FIG. 1 or the variable resistance device 10' of FIG. 2. For descriptive convenience, the variable resistance device includes the variable resistance device 10 of FIG. 1. The voltage (V) applied to the variable resistance device 10 denote the difference between voltages applied to the lower and upper electrodes 11 and 13 of the variable resistance device 10, and more particularly, a value obtained by subtracting the voltage applied to the upper electrode 13 from the voltage applied to the lower electrode 11.

First, a reset voltage $V_{RESET}$ may be applied to the variable resistance device 10, and a read voltage $V_{READ}$ may be applied thereto to sense reset current $I_{RESET}$ flowing through the variable resistance device 10. The read voltage $V_{READ}$ may have an absolute magnitude smaller than that of the reset voltage $V_{RESET}$. A cycle in which the reset voltage $V_{RESET}$ and the read voltage $V_{READ}$ are continuously applied to the variable resistance device 10 may be referred to as a reset cycle. The variable resistance device 10 may be switched from a low resistance state to a high resistance state, i.e., the variable resistance device 10 is switched from an "on" state to an "off" state, when the reset voltage $V_{RESET}$ is applied thereto. In this case, few current may flow through the variable resistance device 10 in the "off" state.

Next, a set voltage $V_{SET}$ may be applied to the variable resistance device 10, and the read voltage $V_{READ}$ may be applied thereto to sense set current $I_{SET}$ flowing through the variable resistance device 10. A cycle in which the set voltage $V_{SET}$ and the read voltage $V_{READ}$ are continuously applied to the variable resistance device 10 may be referred to as a set cycle. The variable resistance device 10 may be switched from the high resistance state to the low resistance state, i.e., the variable resistance device 10 is switched from the "off" state to the "on" state, when the set voltage $V_{SET}$ is applied thereto. In this case, current may flow through the variable resistance device 10 in the "on" state. In this regard, the set voltage $V_{SET}$ applied to the variable resistance device 10 may have a constant value, in particular, a constant absolute value or a constant pulse width.

Next, the reset voltage $V_{RESET}$ may be applied again to the variable resistance device 10, and the read voltage $V_{READ}$ may be applied thereto to sense the reset current $I_{RESET}$ flowing through the variable resistance device 10. In this regard, the reset voltage $V_{RESET}$ applied to the variable resistance device 10 may have a constant value, in particular, a constant absolute value or a constant pulse width.

The polarities of the reset voltage $V_{RESET}$ and the set voltage $V_{SET}$ may be opposite to each other. If the variable resistance device 10 has the reset voltage $V_{RESET}$ and the set voltage $V_{SET}$, the polarities of which are opposite to each other, then the variable resistance device 10 is referred to as a 'bipolar variable resistance device'. In the graph of FIG. 4, the set voltage $V_{SET}$ and the reset voltage $V_{RESET}$ applied to the variable resistance device 10 have a negative value and a positive value, respectively. However, example embodiments are not limited thereto, and the set voltage $V_{SET}$ may have the positive value and the reset voltage $V_{RESET}$ may have the negative value according to the type of material used to form the variable resistance material layer 12 of the variable resistance device 10.

Figure 5:
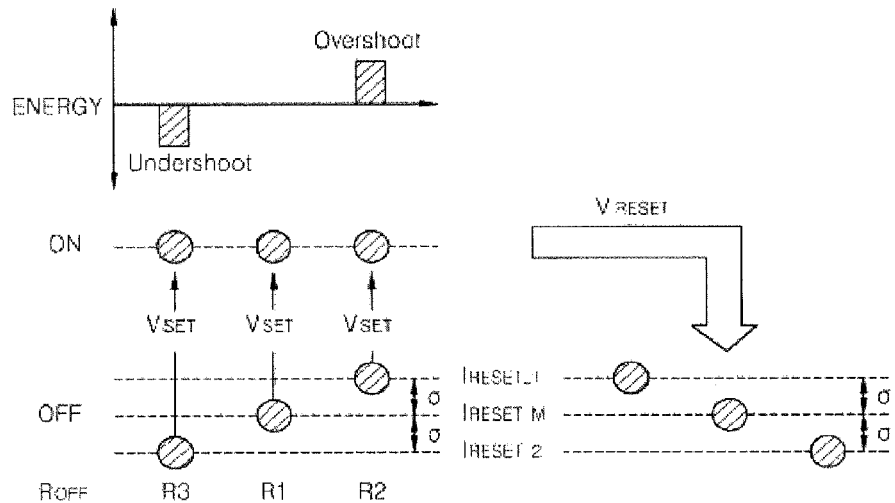
FIG. 5 is a schematic diagram for describing an operation of a variable resistance device when the operating voltages of FIG. 4 are applied to thereto according to an example embodiment.

FIG. 5 is a schematic diagram for describing an operation of the variable resistance device 10 when the operating voltages of FIG. 4 are applied to thereto according to an example embodiment.

Referring to FIG. 5, when the variable resistance device 10 is in the "off" state, the variable resistance device 10 may have the off resistance $R_{OFF}$ that may be divided into the first through the third resistances R1, R2, and R3 as shown in FIG. 3. When the variable resistance device 10 has the first resistance R1, the reset current $I_{RESET}$ flowing through the variable resistance device 10 may have an average level $I_{RESET\_M}$. When the variable resistance device 10 has the second resistance R2, the reset current $I_{RESET}$ flowing through the variable resistance device 10 may have a first level $I_{RESET\_1}$. In this regard, the first level $I_{RESET\_1}$ may be a level (i.e. $I_{RESET\_M}+\sigma$) higher than the average level $I_{RESET\_M}$ by a desired (or alternatively predetermined) level $\sigma$. When the variable resistance device 10 has the third resistance R3, the reset current $I_{RESET}$ flowing through the variable resistance device 10 may have a second level $I_{RESET\_2}$. In this regard, the first level $I_{RESET\_2}$ may be a level (i.e. $I_{RESET\_M}-\sigma$) lower than the average level $I_{RESET\_M}$ by the desired (or alternatively predetermined) level $\sigma$.

The set voltage $V_{SET}$ is applied to the variable resistance device 10 in order to switch the variable resistance device 10 from the "off" state to the "on" state. The set voltage $V_{SET}$ may have a constant value irrespective of the off resistance $R_{OFF}$ of the variable resistance device 10 as shown in FIG. 4. When the set voltage $V_{SET}$ having the constant value is applied to the variable resistance device 10, the characteristics of conductive paths formed when the variable resistance device 10 is in the "on" state may differ each other.

More specifically, when the off resistance $R_{OFF}$ is the second resistance R2, the reset current $I_{RESET}$ flowing through the variable resistance device 10 has the first level $I_{RESET\_1}$ higher than the average level $I_{RESET\_M}$. In this regard, when the set voltage $V_{SET}$ that is equal to the set voltage $V_{SET}$ where the off resistance $R_{OFF}$ is the first resistance R1 or the third resistance R3 is applied to the variable resistance device 10, the variable resistance device 10 may undergo an energy surplus compared to when the off resistance $R_{OFF}$ is the first resistance R1 or the third resistance R3. Accordingly, energy applied to the variable resistance device 10 when the off resistance $R_{OFF}$ is the second resistance R2 may be overshoot compared to energy applied to the variable resistance device 10 when the off resistance $R_{OFF}$ is the first resistance R1.

Meanwhile, when the off resistance $R_{OFF}$ may be the third resistance R3, the reset current $I_{RESET}$ flowing through the variable resistance device 10 has the second level $I_{RESET\_2}$ lower than the average level $I_{RESET\_M}$. In this regard, when the set voltage $V_{SET}$ that is equal to the set voltage $V_{SET}$ where the off resistance $R_{OFF}$ is the first resistance R1 or the second resistance R2 is applied to the variable resistance device 10, the variable resistance device 10 may undergo an energy lack compared to when the off resistance $R_{OFF}$ is the first resistance R1 or the second resistance R2. Accordingly, energy applied to the variable resistance device 10 when the off resistance $R_{OFF}$ is the third resistance R3 may be undershoot compared to energy applied to the variable resistance device 10 when the off resistance $R_{OFF}$ is the first resistance R1.

Next, the reset voltage $V_{RESET}$ is applied to the variable resistance device 10 in order to switch the variable resistance device 10 from the "on" state to the "off" state again. The reset voltage $V_{RESET}$ may have a constant value irrespective of the off resistance $R_{OFF}$ of the variable resistance device 10 as shown in FIG. 4. When the same reset voltage $V_{RESET}$ is applied to the variable resistance device 10, the reset voltage $V_{RESET}$ flowing through the variable resistance device 10 after the reset voltage $V_{RESET}$ is applied to the variable resistance device 10 may have a resistance distribution by the desired (or alternatively predetermined) level $\sigma$ that is the same as the resistance distribution in the "off" state in a previous operation as shown in FIG. 5.

When the constant set voltage $V_{SET}$ is applied to the variable resistance device 10 irrespective of a distribution of the off resistance $R_{OFF}$ of the variable resistance device 10, the variable resistance device 10 may generate conductive paths having different characteristics. Thus, when the variable resistance device 10 is switched from the "on" state to the "off" state again, if the constant reset voltage $V_{RESET}$ is applied to the variable resistance device 10, the reset voltage $V_{RESET}$ may have a distribution by the desired (or alternatively predetermined) level $\sigma$ that is the same as the distribution in the reset voltage $V_{RESET}$ in a previous operation, and accordingly, the off resistance $R_{OFF}$ may have a distribution by the desired (or alternatively predetermined) level $\sigma$ that is the same as the distribution in the off resistance $R_{OFF}$ in a previous operation.

Figure 6:
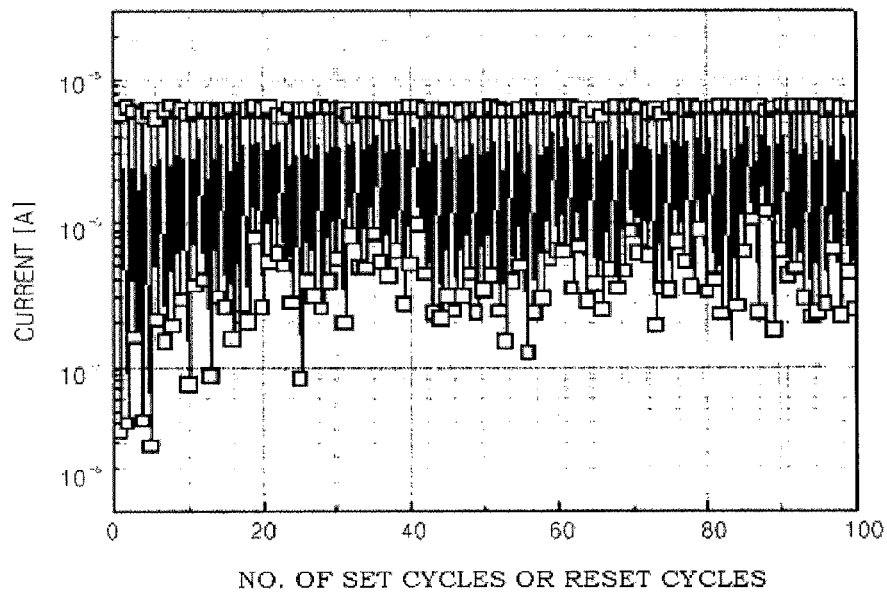
FIG. 6 is a graph showing a variation in the amount of current flowing through the variable resistance device of FIG. 1 when the operating voltages of FIG. 5 are applied to thereto according to an example embodiment.

FIG. 6 is a graph showing a variation in the amount of current flowing through the variable resistance device 10 when the operating voltages of FIG. 4 are applied thereto according to an example embodiment.

Referring to FIG. 6, the X-axis denotes the number of times that the set cycle or the reset cycle is performed, and the Y-axis denotes the amount of current A. In this regard, the variable resistance material layer 12 included in the variable resistance device 10 may include, for example, TaOx, the reset voltage $V_{RESET}$ may be about 4.5 V, the set voltage $V_{SET}$ may be about $-3.5$ V, and pulse widths of the reset voltage $V_{RESET}$ and the set voltage $V_{SET}$ may be about 1 μs.

Current flowing through the variable resistance device 10 after the set cycle, i.e., current sensed when the set voltage $V_{SET}$ and the read voltage $V_{SET}$ are sequentially applied to the variable resistance device 10, is referred to as set current $I_{SET}$. Also, current flowing through the variable resistance device 10 after the reset cycle, i.e., current sensed when the reset voltage $V_{RESET}$ and the read voltage $V_{READ}$ are sequentially applied to the variable resistance device 10, is referred to as reset current $I_{RESET}$.

In FIG. 6, the set current $I_{SET}$ is maintained at a constant current level of about 1.00 E-5 A. That is, the set current $I_{SET}$ is maintained at a constant current level regardless of a number of times that the set cycle is performed. However, the reset current $I_{RESET}$ has a relatively large dispersion and is maintained at a current level of about 1.00 E-9 to about 1.00 E-7. In this case, the reset current $I_{RESET}$ shows a non-linear distribution regardless of a number of times that the reset cycle is performed.

As described above, in the variable resistance device 10, the set current $I_{SET}$ has a relatively small dispersion and the reset current $I_{RESET}$ has a relatively large dispersion. Thus, the relatively large dispersion for the reset current $I_{RESET}$ may reduce a sensing margin between the 'on' state and the 'off' state of the variable resistance device 10.

Figure 7:
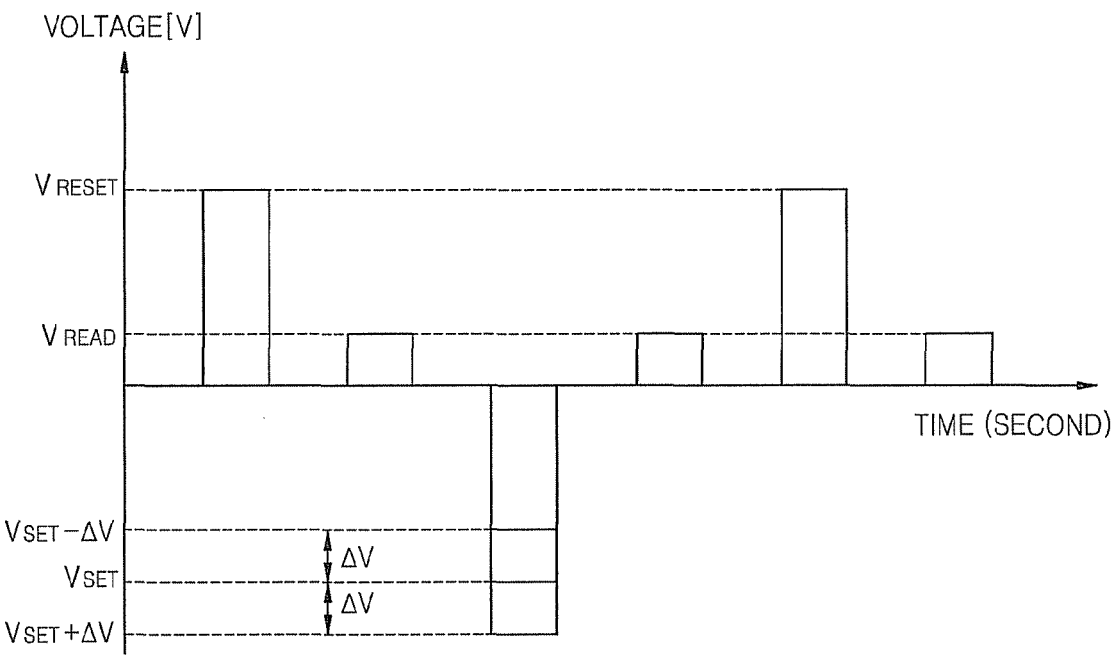
FIG. 7 is a graph showing operating voltages applied to a variable resistance device, according to another example embodiment.

FIG. 7 is a graph showing operating voltages applied to a variable resistance device, according to another example embodiment.

Referring to FIG. 7, the X-axis denotes time (seconds) and the Y-axis denotes a voltage (V) applied to the variable resistance device 10. The variable resistance device may include the variable resistance device 10 of FIG. 1 or the variable resistance device 10' of FIG. 2. For descriptive convenience, the variable resistance device includes the variable resistance device 10 of FIG. 1. The voltage (V) applied to the variable resistance device 10 denote the difference between voltages applied to the lower and upper electrodes 11 and 13 of the variable resistance device 10, and more particularly, a value obtained by subtracting the voltage applied to the upper electrode 13 from the voltage applied to the lower electrode 11.

First, the reset voltage $V_{RESET}$ may be applied to the variable resistance device 10, and the read voltage $V_{READ}$ may be applied thereto to sense reset current $I_{RESET}$ flowing through the variable resistance device 10. The read voltage $V_{READ}$ may have an absolute magnitude smaller than that of the reset voltage $V_{RESET}$. The variable resistance device 10 may be switched from a low resistance state to a high resistance state, i.e., the variable resistance device 10 is switched from an "on" state to an "off" state, when the reset voltage $V_{RESET}$ is applied thereto. In this case, few current may flow through the variable resistance device 10.

Next, the set voltage $V_{SET}$ may be applied to the variable resistance device 10, and the read voltage $V_{READ}$ may be applied thereto to sense set current $I_{SET}$ flowing through the variable resistance device 10. The read voltage $V_{READ}$ may have an absolute magnitude smaller than that of the set voltage $V_{SET}$. The variable resistance device 10 may be switched from the high resistance state to the low resistance state, i.e., the variable resistance device 10 is switched from the "off" state to the "on" state, when the set voltage $V_{SET}$ is applied thereto. In this case, current may flow through the variable resistance device 10.

According to an example embodiment, as illustrated in FIG. 7, the set voltage $V_{SET}$ applied to the variable resistance device 10 may have a variable value, in particular, a variable absolute value or a variable pulse width, according to a distribution of the reset current $I_{RESET}$ flowing through the variable resistance device 10 in the "off" state in a previous operation, i.e. according to a distribution of the off resistance $R_{OFF}$ of the variable resistance device 10.

In particular, the higher the off resistance $R_{OFF}$ in the previous operation, the smaller the value of the reset current $I_{RESET}$, and thus a relatively great amount of energy may be necessary for switching the variable resistance device 10 from the "off" state to the "on" state. In this case, the set voltage $V_{SET}$ may be determined to have a relatively large value, i.e. a relatively large absolute value or pulse width.

Meanwhile, the lower the off resistance $R_{OFF}$ in the previous operation, the greater the value of the reset current $I_{RESET}$, and thus a relatively small amount of energy may be necessary for switching the variable resistance device 10 from the "off" state to the "on" state. In this case, the set voltage $V_{SET}$ may be determined to have a relatively small value, i.e. a relatively small absolute value or pulse width.

Next, the reset voltage $V_{RESET}$ may be again applied to the variable resistance device 10, and the read voltage $V_{READ}$ may be applied thereto to sense the reset current $I_{RESET}$ flowing through the variable resistance device 10. In this regard, the reset voltage $V_{RESET}$ applied to the variable resistance device 10 may have a constant value, in particular, a constant absolute value or a constant pulse width.

Figure 8:
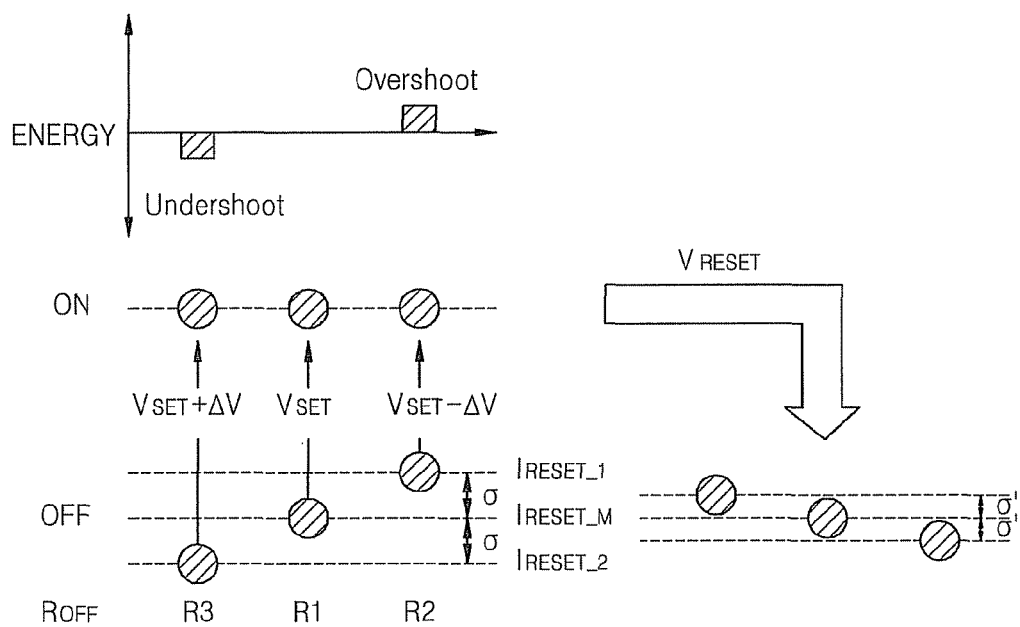
FIG. 8 is a schematic diagram for describing an operation of a variable resistance device when the operating voltages of FIG. 7 are applied to thereto according to another example embodiment.

FIG. 8 is a schematic diagram for describing an operation of the variable resistance device 10 when the operating voltages of FIG. 7 are applied to thereto according to an example embodiment.

Referring to FIG. 8, when the variable resistance device 10 is in the "off" state, the variable resistance device 10 may have the off resistance $R_{OFF}$ that may be divided into the first through the third resistances R1, R2, and R3 as shown in FIG. 3. When the variable resistance device 10 has the first resistance R1, the reset current $I_{RESET}$ flowing through the variable resistance device 10 may have an average level $I_{RESET\_M}$. When the variable resistance device 10 has the second resistance R2, the reset current $I_{RESET}$ flowing through the variable resistance device 10 may have a first level $I_{RESET\_1}$. In this regard, the first level $I_{RESET\_1}$ may be a level (i.e. $I_{RESET\_M}+\sigma$) higher than the average level $I_{RESET\_M}$ by a desired (or alternatively predetermined) level $\sigma$. When the variable resistance device 10 has the third resistance R3, the reset current $I_{RESET}$ flowing through the variable resistance device 10 may have a second level $I_{RESET\_2}$. In this regard, the first level $I_{RESET\_2}$ may be a level (i.e. $I_{RESET\_M}-\sigma$) lower than the average level $I_{RESET\_M}$ by the desired (or alternatively predetermined) level $\sigma$.

The set voltage $V_{SET}$ is applied to the variable resistance device 10 in order to switch the variable resistance device 10 from the "off" state to the "on" state. The set voltage $V_{SET}$ may be variable according to a distribution of the off resistance $R_{OFF}$ of the variable resistance device 10 as shown in FIG. 7. When the variable set voltage $V_{SET}$ is applied to the variable resistance device 10 according to a distribution of the off resistance $R_{OFF}$, an energy level of the variable resistance device 10 may be relatively uniform when the variable resistance device 10 is switched to the "on" state.

More specifically, when the off resistance $R_{OFF}$ is the second resistance R2, the reset current $I_{RESET}$ flowing through the variable resistance device 10 has the first level $I_{RESET\_1}$ higher than the average level $I_{RESET\_M}$. In this regard, a set voltage $V_{SET}-\Delta V$ that is smaller by a desired (or alternatively predetermined) level $\Delta V$ than the set voltage $V_{SET}$ applied to the variable resistance device 1 when the off resistance $R_{OFF}$ is the first resistance R1 may be applied to the variable resistance device 1, thereby reducing an energy surplus in the variable resistance device 10 when the variable resistance device 10 is switched to the "on" state. Accordingly, an overshoot of energy applied to the variable resistance device 10 when the variable resistance device 10 is switched to the "on" state and the off resistance $R_{OFF}$ is the second resistance R2 may be reduced compared to the overshoot as shown in FIG. 5.

Meanwhile, when the off resistance $R_{OFF}$ may be the third resistance R3, the reset current $I_{RESET}$ flowing through the variable resistance device 10 has the second level $I_{RESET\_2}$ lower than the average level $I_{RESET\_M}$. In this regard, a set voltage $V_{SET}+\Delta V$ that is greater by the desired (or alternatively predetermined) level $\Delta V$ than the set voltage $V_{SET}$ applied to the variable resistance device 1 when the off resistance $R_{OFF}$ is the first resistance R1 may be applied to the variable resistance device 1, thereby reducing an energy lack in the variable resistance device 10 when the variable resistance device 10 is switched to the "on" state. Accordingly, an undershoot of energy applied to the variable resistance device 10 when the variable resistance device 10 is switched to the "on" state and the off resistance $R_{OFF}$ is the third resistance R3 may be reduced compared to the undershoot as shown in FIG. 5.

Energy necessary for forming a conductive path when the variable resistance device 10 is switched to the "on" state may be expressed according to Equation 1 below, $$P=IV=V^2/R \qquad \text{[Equation 1]}$$

wherein, I denotes the set current $I_{SET}$, V denotes the set voltage $V_{SET}$, and R denotes the off resistance $R_{OFF}$. Thus, the distribution of the off resistance $R_{OFF}$ may be offset at the set voltage $V_{SET}$ by varying or maintaining the set voltage $V_{SET}$ according to a distribution of R, i.e. the distribution of the off resistance $R_{OFF}$. Thus, the greater the distribution of the off resistance $R_{OFF}$, the greater the variation of the set voltage $V_{SET}$. Accordingly, the energy necessary for forming the conductive path when the variable resistance device 10 is switched to the "on" state may be maintained relatively uniform.

Next, the reset voltage $V_{RESET}$ is applied to the variable resistance device 10 in order to switch the variable resistance device 10 from the "on" state to the "off" state again. The reset voltage $V_{RESET}$ may have a constant value irrespective of the off resistance $R_{OFF}$ of the variable resistance device 10 as shown in FIG. 7. In this regard, the reset current $I_{RESET}$ flowing through the variable resistance device 10 after the reset voltage $V_{RESET}$ is applied to the variable resistance device 10 may have a distribution of a level σ' that is reduced compared to the "off" state in a previous operation.

According to an example embodiment, the set voltage $V_{SET}$ is determined to be variable according to the distribution of the off resistance $R_{OFF}$ in the previous operation, and the determined set voltage is applied to the variable resistance device 10. Accordingly, although the same reset voltage $V_{RESET}$ is applied to the variable resistance device 10 in a next operation, a distribution of the reset current $I_{RESET}$ flowing through the variable resistance device 10 may be greatly reduced compared to the "off" state in the previous operation as shown in FIG. 8.

Figure 9:
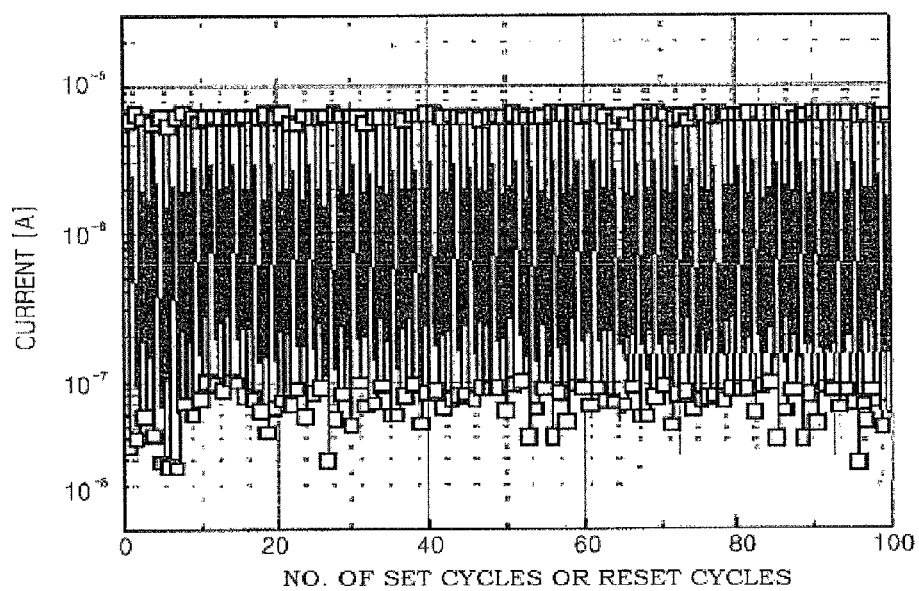
FIG. 9 is a graph showing a variation in the amount of current flowing through a variable resistance device when the operating voltages of FIG. 7 are applied to thereto according to another example embodiment.

FIG. 9 is a graph showing a variation in the amount of current flowing through a variable resistance device when the operating voltages of FIG. 7 are applied to thereto according to another example embodiment.

Referring to FIG. 9, the X-axis denotes the number of times that the set cycle or the reset cycle is performed, and the Y-axis denotes the amount of current A. In this regard, the variable resistance material layer 12 included in the variable resistance device 10 may include, for example, TaOx, the reset voltage $V_{RESET}$ may be about 4.5 V, and a pulse width of the reset voltage $V_{RESET}$ may be about 1 μs. An absolute value or a pulse width of the set voltage $V_{SET}$ may be determined to be variable.

Current flowing through the variable resistance device 10 after the set cycle, i.e., current sensed when the set voltage $V_{SET}$ and the read voltage $V_{SET}$ are sequentially applied to the variable resistance device 10, is referred to as set current $I_{SET}$. Also, current flowing through the variable resistance device 10 after the reset cycle, i.e., current sensed when the reset voltage $V_{RESET}$ and the read voltage $V_{READ}$ are sequentially applied to the variable resistance device 10, is referred to as reset current $I_{RESET}$.

In FIG. 9, the set current $I_{SET}$ is maintained at a constant current level of about 1.00 E-5 A. That is, the set current $I_{SET}$ is maintained at a constant current level regardless of a number of times that the set cycle is performed. However, the reset current $I_{RESET}$ is maintained at a current level of about 1.00 E-8 to about 1.00 E-7. In this case, a distribution of the reset current $I_{RESET}$ is reduced compared to the distribution of the reset current $I_{RESET}$ shown in FIG. 6.

Figure 10:
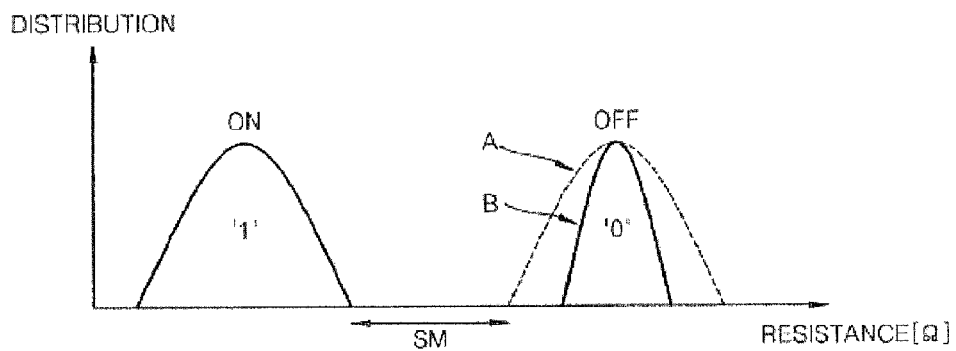
FIG. 10 is a graph showing a resistance distribution of a variable resistance device with respect to the graph of FIG. 9 according to an example embodiment.

FIG. 10 is a graph showing a resistance distribution of the variable resistance device 10 with respect to the graph of FIG. 9 according to an example embodiment.

Referring to FIG. 10, the X-axis denotes a resistance value of the variable resistance device, and the Y-axis denotes the total number of resistance devices. In this regard, reference numeral A denotes a distribution of the off resistance $R_{OFF}$ according to FIGS. 4 and 5, and reference numeral B denotes a distribution of the off resistance $R_{OFF}$ according to example embodiments, i.e. FIGS. 7 and 8.

The set voltage $V_{SET}$ determined to be variable according to the distribution of the off resistance $R_{OFF}$ is applied to the variable resistance device 10, which makes energy, of the variable resistance device 10 relatively uniform when the variable resistance device 10 is in an "on" state, thereby greatly reducing the distribution of the off resistance $R_{OFF}$ when the variable resistance device 10 is in an "off" state in a next operation.

Figure 11:
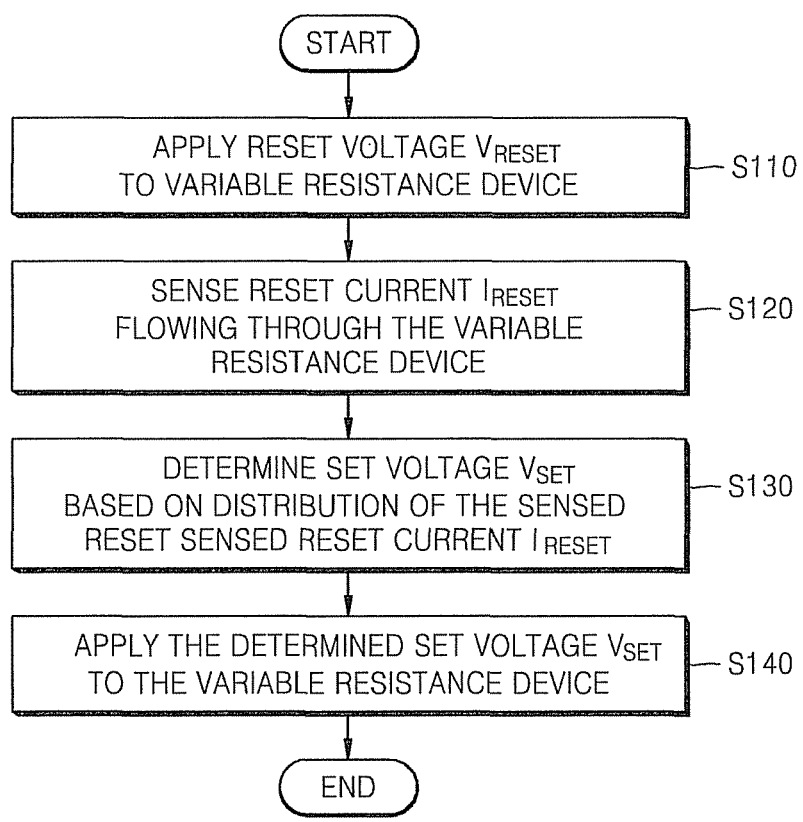
FIG. 11 is a flowchart illustrating a method of operating a semiconductor device including a variable resistance device, according to an example embodiment.

FIG. 11 is a flowchart illustrating a method of operating a semiconductor device including a variable resistance device, according to an example embodiment.

Referring to FIG. 11, a method of operating the semiconductor device of according to an example embodiment may be a method of operating a semiconductor device including the variable resistance device 10 of FIG. 1 or the variable resistance device 10' of FIG. 2. A method according to an example embodiment will now be described, for example, in relation to the variable resistance device 10 of FIG. 1. The detailed descriptions described with reference to FIGS. 1 through 10 will apply.

In operation S110, the reset voltage $V_{RESET}$ is applied to the variable resistance device 10. The variable resistance device 10 may be switched from a low resistance state to a high resistance state, i.e., the variable resistance device 10 is switched from an "on" state to an "off" state. The reset voltage $V_{RESET}$ may be about 4.5 V.

In operation S120, the reset current $I_{RESET}$ flowing through the variable resistance device 10 to which the reset voltage $V_{RESET}$ is applied, is sensed. More specifically, the read voltage $V_{READ}$ having a smaller absolute value than the reset voltage $V_{RESET}$ may be applied to the variable resistance device 10 to which the reset voltage $V_{RESET}$ is applied, and then the reset current $I_{RESET}$ flowing through the variable resistance device 10 may be sensed.

In operation S130, the set voltage $V_{SET}$ is determined based on a distribution of the sensed reset current $I_{RESET}$. More specifically, an absolute value or a pulse width of the set voltage $V_{SET}$ is determined based on the distribution of the sensed reset current $I_{RESET}$, i.e. a distribution of the off resistance $R_{OFF}$ of the variable resistance device 10. This will be in more detail described with reference to FIGS. 12 and 13 below.

In operation S140, the determined set voltage $V_{SET}$ is applied to the variable resistance device 10. Accordingly, the variable resistance device 10 may be switched from the high resistance state to the low resistance state, i.e., the variable resistance device 10 is switched from the "off" state to the "on" state.

The method may further include sensing the set current $I_{SET}$ flowing through the variable resistance device 10 to which the set voltage $V_{SET}$ is applied. More specifically, the read voltage $V_{READ}$ having a smaller absolute value than the set voltage $V_{SET}$ may be applied to the variable resistance device 10 to which the set voltage $V_{SET}$ is applied, and then the set current $I_{SET}$ flowing through the variable resistance device 10 may be sensed. Further, the method may perform operation S110 again after performing operation S140.

Figure 12:
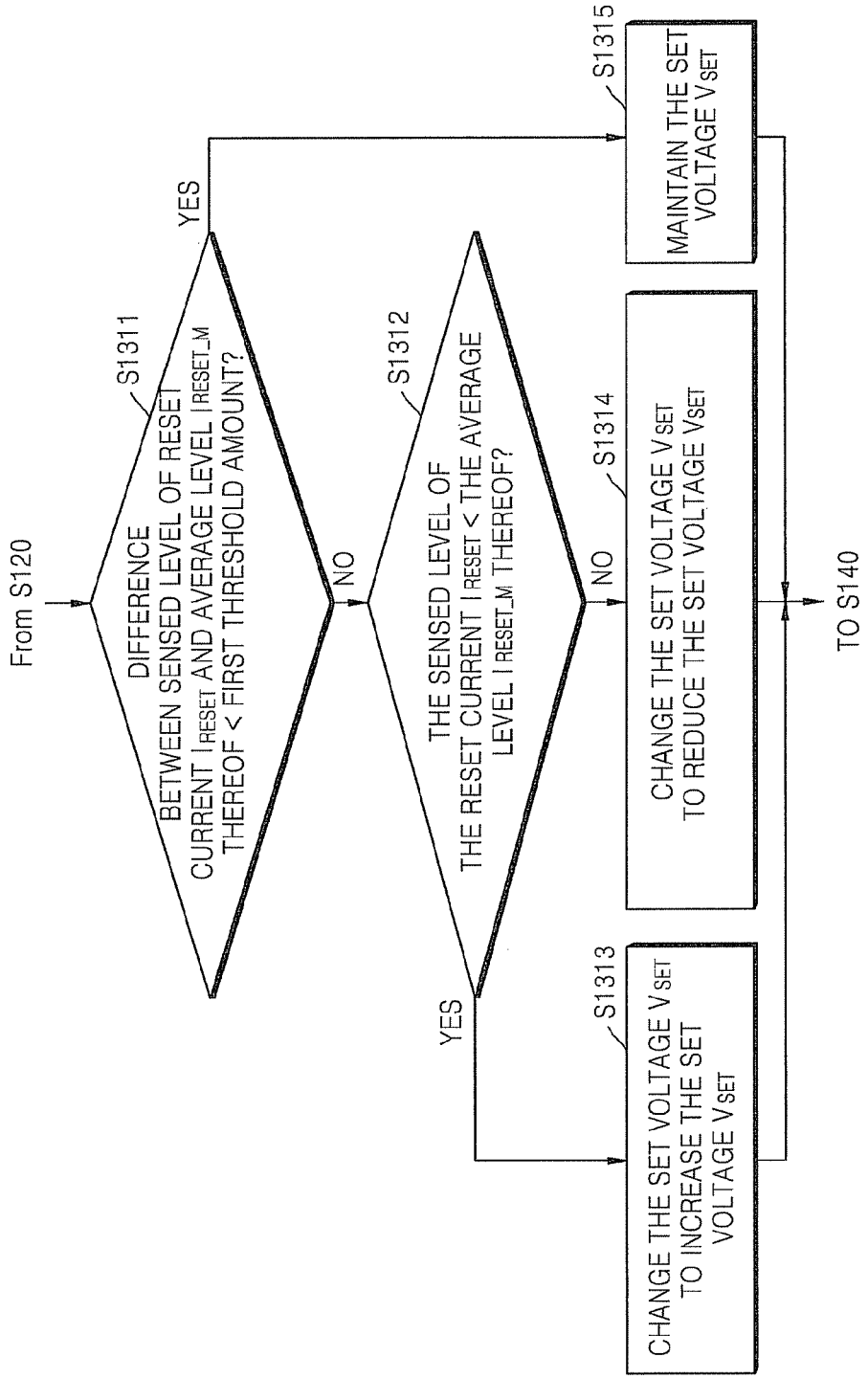
FIG. 12 is a flowchart illustrating an operation of determining a set voltage included in FIG. 11, according to an example embodiment.

FIG. 12 is a flowchart illustrating an operation of determining the set voltage $V_{SET}$ included in FIG. 11, according to an example embodiment.

Referring to FIG. 12, in operation S1311, it is determined whether a difference between the sensed level of the reset current $I_{RESET}$ and the average level $I_{RESET\_M}$ thereof is smaller than a first threshold amount. The first threshold amount may be a desired (or alternatively predetermined) ranged of distribution of reset current $I_{RESET}$, but example embodiments are not limited thereto. If it is determined that the difference between the sensed level of the reset current $I_{RESET}$ and the average level $I_{RESET\_M}$ thereof is smaller than the first threshold amount, operation S1315 is performed. Meanwhile, if it is determined that the difference between the sensed level of the reset current $I_{RESET}$ and the average level $I_{RESET\_M}$ thereof is greater than the first threshold amount, operation S1312 is performed. In this regard, the first threshold amount may be a desired amount and/or previously determined. More specifically, the first threshold amount may be further narrowed in order to increase the reliability of a semiconductor device.

In operation S1312, it is determined whether the sensed level of the reset current $I_{RESET}$ is smaller than the average level $I_{RESET\_M}$ thereof. If it is determined that the sensed level of the reset current $I_{RESET}$ is smaller than the average level $I_{RESET\_M}$ thereof, operation S1313 is performed. Meanwhile, if it is determined that the sensed level of the reset current $I_{RESET}$ is greater than the average level $I_{RESET\_M}$ thereof, operation S1314 is performed.

In operation S1313, the set voltage $V_{SET}$ is changed to increase the set voltage $V_{SET}$. More specifically, if the sensed level of the reset current $I_{RESET}$ is smaller than the average level $I_{RESET\_M}$ thereof, an energy level necessary for switching the variable resistance device 10 from an "off" state to an "on" state is relatively large.

In operation S1314, the set voltage $V_{SET}$ is changed to reduce the set voltage $V_{SET}$. More specifically, if the sensed level of the reset current $I_{RESET}$ is greater than the average level $I_{RESET\_M}$ thereof, the energy level necessary for switching the variable resistance device 10 from the "off" state to the "on" state is relatively small.

Therefore, as described in operations S1313 and S1314, the set voltage $V_{SET}$ is changed to increase or reduce the set voltage $V_{SET}$ according to a distribution of the reset current $I_{RESET}$, and thus the energy level of the variable resistance device 10 may be relatively uniform when the variable resistance device 10 is in the "on" state.

In operation S1315, the set voltage $V_{SET}$ is maintained. More specifically, if the difference between the sensed level of the reset current $I_{RESET}$ and the average level $I_{RESET\_M}$ thereof is smaller than the first threshold amount, since it is unnecessary to change the set voltage $V_{SET}$, it may be determined to maintain the set voltage $V_{SET}$. The first threshold amount may be a desired (or alternatively predetermined) ranged of distribution of reset current $i_{RESET}$, but example embodiments are not limited thereto.

Figure 13:
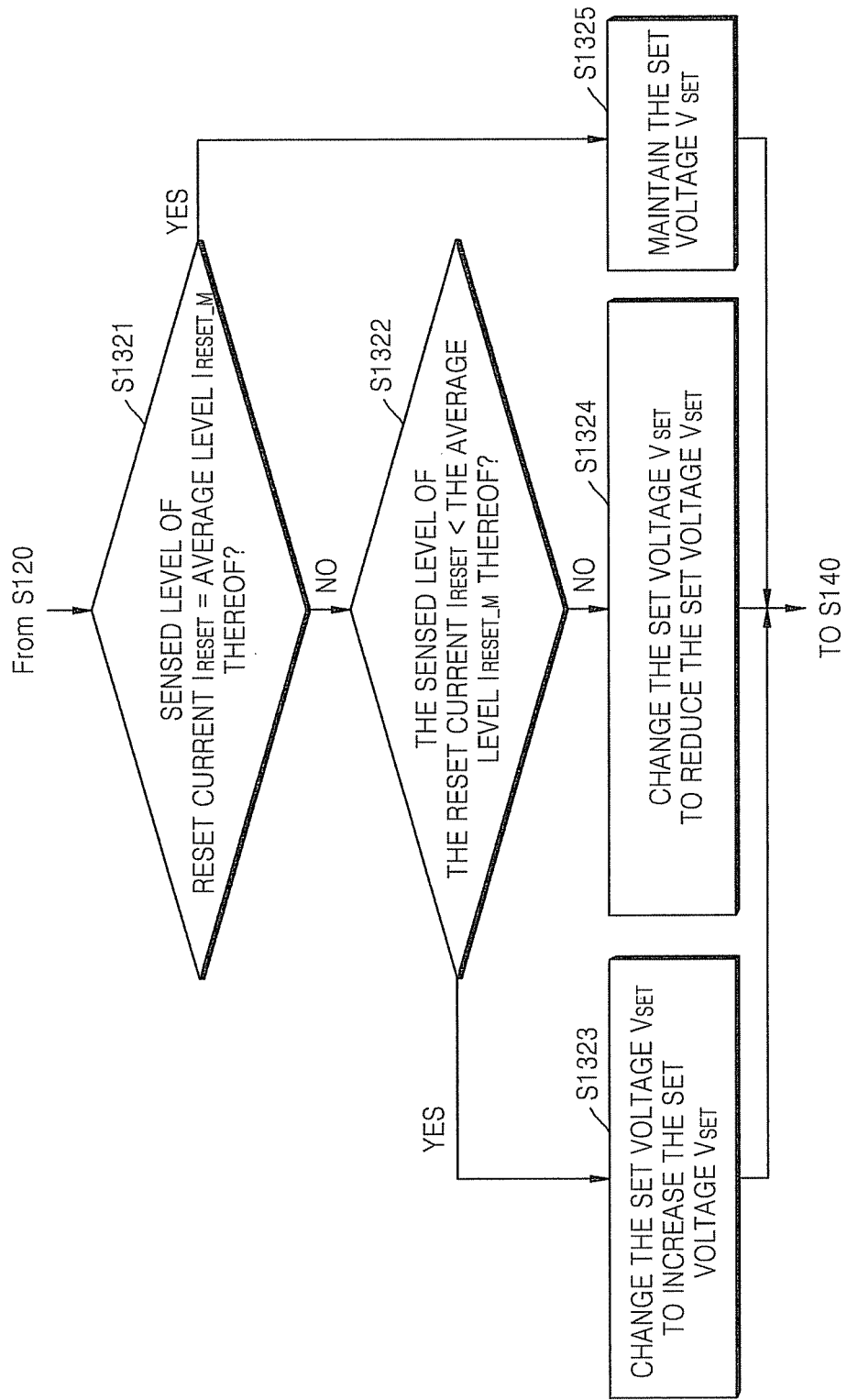
FIG. 13 is a flowchart illustrating an operation of determining a set voltage included in FIG. 11, according to another example embodiment.

FIG. 13 is a flowchart illustrating an operation of determining a set voltage included in FIG. 11, according to another example embodiment.

Referring to FIG. 13, in operation S1321, it is determined whether the sensed level of the reset current $I_{RESET}$ is substantially equal to the average level $I_{RESET\_M}$ thereof. If it is determined that the sensed level of the reset current $I_{RESET}$ is substantially equal to the average level $I_{RESET\_M}$ thereof, operation S1325 is performed. For example, the sensed level of the reset current $I_{RESET}$ may be considered substantially equal to the average level $I_{RESET\_M}$ if the ratio of $I_{RESET}/I_{RESET\_M}$ is about 0.90 to about 1.10, and/or more particularly from about 0.95 to about 1.05, and/or even more particularly from about 0.98 to about 1.02. Meanwhile, if it is determined that the sensed level of the reset current $I_{RESET}$ is not substantially equal to the average level $I_{RESET\_M}$ thereof, operation S1322 is performed.

In operation S1322, it is determined whether the sensed level of the reset current $I_{RESET}$ is smaller than the average level $I_{RESET\_M}$ thereof. If it is determined that the sensed level of the reset current $I_{RESET}$ is smaller than the average level $I_{RESET\_M}$ thereof, operation S1323 is performed. Meanwhile, if it is determined that the sensed level of the reset current $I_{RESET}$ is greater than the average level $I_{RESET\_M}$ thereof, operation S1324 is performed.

In operation S1323, the set voltage $V_{SET}$ is changed to increase the set voltage $V_{SET}$. More specifically, if the sensed level of the reset current $I_{RESET}$ is smaller than the average level $I_{RESET\_M}$ thereof, an energy level necessary for switching the variable resistance device 10 from an "off" state to an "on" state is relatively large.

In operation S1324, the set voltage $V_{SET}$ is changed to reduce the set voltage $V_{SET}$. More specifically, if the sensed level of the reset current $I_{RESET}$ is greater than the average level $I_{RESET\_M}$ thereof, the energy level necessary for switching the variable resistance device 10 from the "off" state to the "on" state is relatively small.

Therefore, as described in operations S1323 and S1324, the set voltage $V_{SET}$ is changed to increase or reduce the set voltage $V_{SET}$ according to a distribution of the reset current $I_{RESET}$, and thus the energy level of the variable resistance device 10 may be relatively uniform when the variable resistance device 10 is in the "on" state.

In operation S1325, the set voltage $V_{SET}$ is maintained. More specifically, if the sensed level of the reset current $I_{RESET}$ is substantially equal to the average level $I_{RESET\_M}$ thereof, since it is unnecessary to change the set voltage $V_{SET}$, it may be determined to maintain the set voltage $V_{SET}$.

Figure 14:
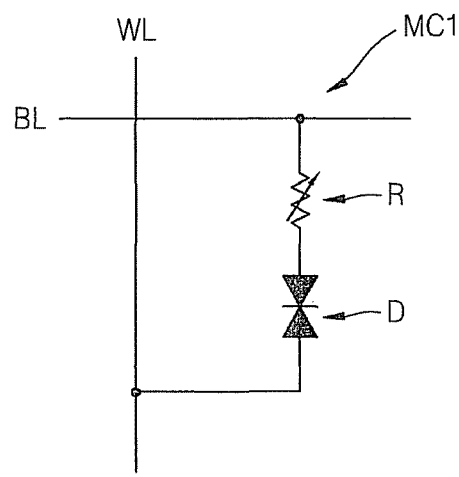
FIG. 14 is a circuit diagram of a semiconductor device including a variable resistance device, according to an example embodiment.

FIG. 14 is a circuit diagram of a semiconductor device including a variable resistance device R, according to an example embodiment.

Referring to FIG. 14, the semiconductor device may be, for example, a non-volatile memory device, and a unit cell MC1 thereof may include the variable resistance device R and a diode D. The variable resistance device R may be the same as and/or substantially the same as the variable resistance device 10 of FIG. 1 or the variable resistance device 10' of FIG. 2. A first end of the variable resistance device R is connected to a bit line BL and a second end thereof is connected to the diode D. The diode D may operate bi-directionally, and may select the unit cell MC1 according to a voltage applied to a word line WL.

If the semiconductor device is a single-bit non-volatile memory device, then the variable resistance device R may be switched from a low resistance state to a high resistance state and data '0' may be written to the semiconductor device when the reset voltage is applied to the variable resistance device R, and may be switched from the high resistance state to the low resistance state and data '1' may be written to the semiconductor device when the set voltage is applied to the variable resistance device R. In this case, a set voltage may be determined based on a distribution of a reset current flowing through the variable resistance device R when the variable resistance device R is in the high resistance state, i.e. based on a distribution of an off resistance of the variable resistance device R.

Figure 15:
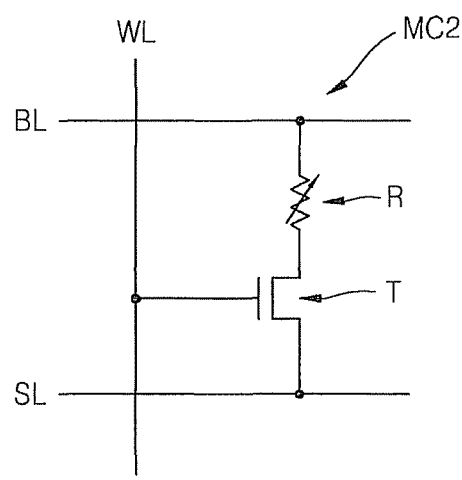
FIG. 15 is a circuit diagram of a semiconductor device including a variable resistance device, according to another example embodiment.

FIG. 15 is a circuit diagram of a semiconductor device including a variable resistance device R, according to another example embodiment. Referring to FIG. 15, the semiconductor device may be, for example, a non-volatile memory device, and a unit cell MC2 thereof may include a variable resistance device R and an access transistor T. The variable resistance device R may be the same as and/or substantially the same as the variable resistance device 10 of FIG. 1 or the variable resistance device 10' of FIG. 2. A first end of the variable resistance device R is connected to a bit line BL and a second end thereof is connected to the access transistor T. The access transistor T includes a gate connected to a word line WL, a drain connected to the second end of the variable resistance device R, and a source connected to a source line SL. The access transistor T may be switched on or off to select the unit cell MC2, according to a voltage applied to the word line WL.

If the semiconductor device is a single-bit non-volatile memory device, then the variable resistance device R may be switched from a low resistance state to a high resistance state and data '0' may be written to the semiconductor device when reset voltage is applied to the variable resistance device R, and may be switched from the high resistance state to the low resistance state and data '1' may be written to the semiconductor device when set voltage is applied to the variable resistance device R. In this case, a set voltage may be determined based on a distribution of a reset current flowing through the variable resistance device R when the variable resistance device R is in the high resistance state, i.e. based on a distribution of an off resistance of the variable resistance device R.

Figure 16:
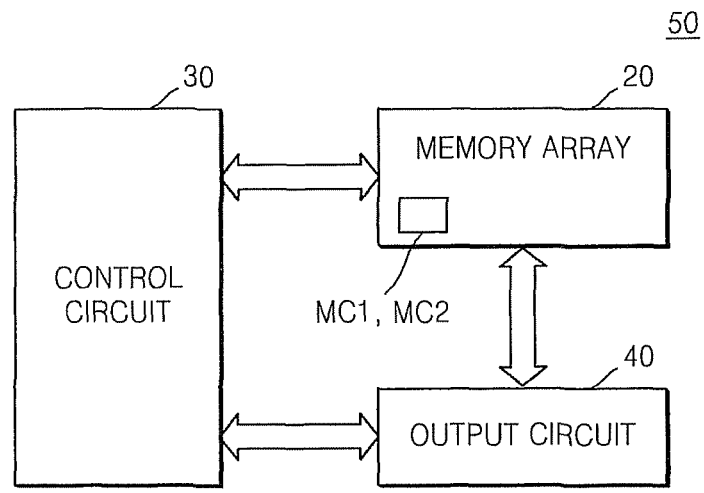
FIG. 16 is a schematic block diagram of a semiconductor device according to an example embodiment.

FIG. 16 is a schematic block diagram for a semiconductor device 50 according to an example embodiment. As shown in FIG. 16, a semiconductor device 50 includes a memory array 20, a control circuit 30, and an output circuit 40. The memory array 20 may include a plurality of unit cells MC1 and/or MC2, as shown in FIG. 14-15, but example embodiments are not limited thereto. The control circuit 30 is operatively connected to the memory array 20 and configured to sense a reset current $I_{RESET}$ and/or set current $I_{SET}$ from the variable resistance device R of unit cells MC1 and/or MC2. The control circuit 30 is configured to receive a signal indicating the current sensed from the variable resistance device R of unit cells MC1 and/or MC2, for example the reset current $I_{RESET}$ and/or set current $I_{SET}$. The control circuit 30 is configured to cause the application of a reset voltage $V_{RESET}$ and/or set voltage $V_{SET}$ to the variable resistance device R of unit cells MC1 and/or MC2, for example by causing the application of a voltage between an upper and lower electrode of the variable resistance device R in unit cells MC1 and/or MC2. Based on the reset current $I_{RESET}$ sensed, the control circuit 30 determines a set voltage $V_{SET}$ and causes the application of the set voltage $V_{SET}$ to the variable resistance device R of unit cells MC1 and/or MC2. The control circuit 30 may determine the set voltage according to the foregoing methods described in FIGS. 11-13, but example embodiments are not limited thereto. The output circuit 40 is operatively connected to the memory array 20 and the control circuit 30. The output circuit 40 is configured to output, for example data read from the memory array 20 under the control of the control circuit 30.

Figure 17:
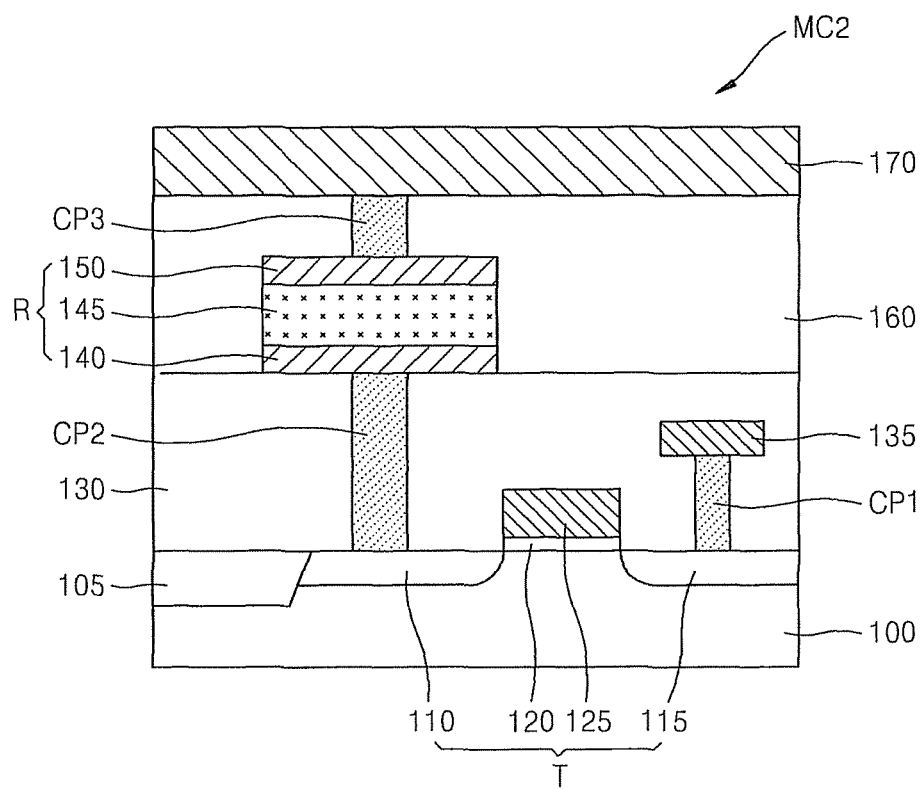
FIG. 17 is a cross-sectional view of the semiconductor device of FIG. 15, according to an example embodiment.

FIG. 17 is a cross-sectional view of the semiconductor device of FIG. 15, according to an example embodiment. Referring to FIG. 17, an isolation layer 105 is formed in a region of a semiconductor substrate 100 so as to define an active region. A drain region 110 and a source region 115 are formed in the active region to be disposed apart from each other. A gate insulating layer 120 is disposed on the active region between the drain region 110 and the source region 115, and a gate electrode 125 is disposed on the gate insulating layer 120. The gate electrode 125 may extend to act as a word line or may be connected to a word line (not shown). The gate electrode 125, the drain region 110, and the source region 115 form an access transistor T together.

A first interlevel insulating layer 130 is formed on the access transistor T, and a first contact plug CP1 and a second contact plug CP2 are formed in the first interlevel insulating layer 130. The source region 115 may be connected to a source line SL via the first contact plug CP1 and a source line electrode 135, and the drain region 110 may be connected to a lower electrode 140 via the second contact plug CP2.

A second interlevel insulating layer 160 is formed on the first interlevel insulating layer 130, and the lower electrode 140, a variable resistance material layer 145, and an upper electrode 150 are sequentially formed in a region of the second interlevel insulating layer 160. The upper electrode 150 may be connected to a bit line 170 via a third contact plug CP3. The lower electrode 140, the variable resistance material layer 145, and the upper electrode 150 form a variable resistance device R together. The variable resistance device R corresponds to the variable resistance device 10 of FIG. 1.

Cases where variable resistance devices according to example embodiments are included in a single-bit non-volatile memory device have been described above in detail. However, the variable resistance devices according to example embodiments may be included in a multi-bit non-volatile memory device.

Further, each of variable resistance devices according to example embodiments may be included into a logic gate so as to be used in a logic circuit. In this case, the size of the logic circuit may be reduced and the integration degree of a memory device may be improved. Particularly, a variable resistance device according to an example embodiment may be applied to a memristor. Thus, the memristor may operate substantially in a similar manner to one of the methods of operating a semiconductor device described above with reference to FIGS. 7 to 13. Here, the "memristor" refers to a device, in which, for example, the direction and amount of current are memorized and a resistance value varies according to the memorized direction and amount of current.

Figure 18:
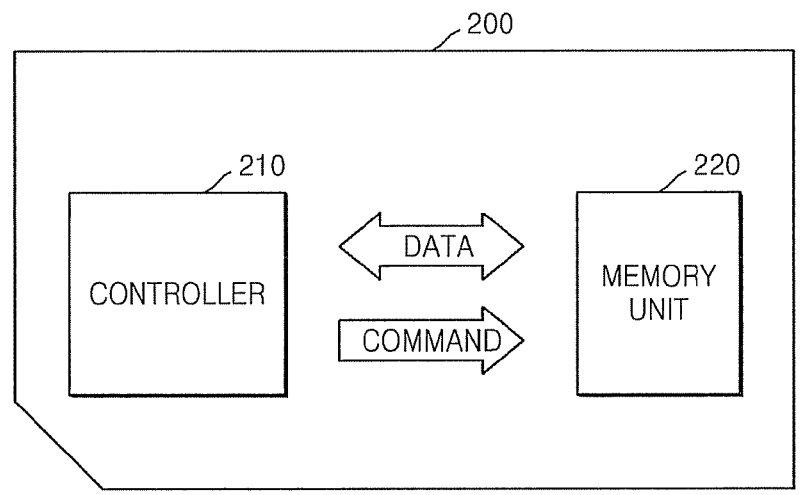
FIG. 18 is a schematic block diagram of a memory card according to an example embodiment.

FIG. 18 is a schematic block diagram of a memory card 200 according to an example embodiment.

Referring to FIG. 18, the memory card 200 includes a controller 210 and a memory unit 220. The controller 210 and the memory unit 220 may be disposed to exchange an electrical signal with each other. For example, if the controller 210 provides a command to the memory unit 220, then the memory unit 220 may transmit data to the controller 210. The memory unit 220 may include a non-volatile memory device that includes a variable resistance device according to one of the example embodiments describe above.

The memory card 200 may be embodied in various types of cards (memory devices), e.g., a memory stick card, a smart media (SM) card, a secure digital (SD) card, a mini SD card, and a multi-media card (MMC).

Figure 19:
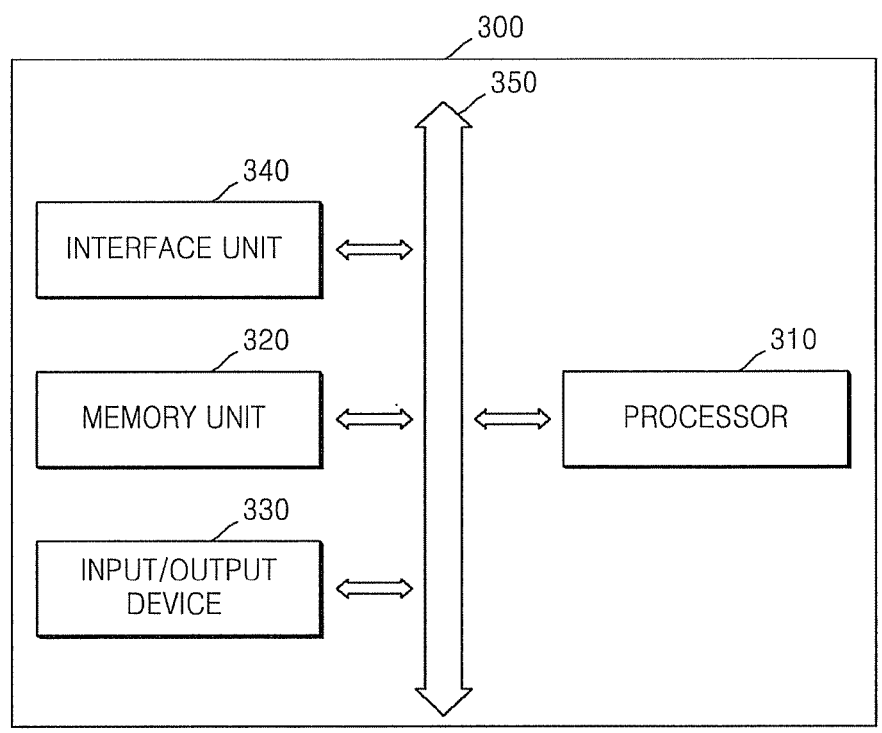
FIG. 19 is a schematic block diagram of an electronic system according to an example embodiment.

FIG. 19 is a schematic block diagram of an electronic system 300 according to an example embodiment.

Referring to FIG. 19, the electronic system 300 may include a processor 310, a memory unit 320, an input/output (I/O) device 330, and an interface unit 340. The electronic system 300 may be a mobile system or a system capable of transmitting and receiving information. The mobile system may be a personal digital assistant (PDA), a portable computer, a web tablet, a wireless phone, a mobile phone, a digital music player, or a memory card.

The processor 310 may execute a program and control the electronic system 300. The processor 310 may be, for example, a microprocessor, a digital signal processor, a microcontroller, or the like.

The I/O device 330 may be used to input data to or output data from the electronic system 300. The electronic system 300 may be connected to an external device (not shown), such as a personal computer (PC) or a network, via the I/O device 330 so as to exchange data with the external device. The I/O device 330 may be, for example, a keypad, a keyboard, or a display.

The memory unit 320 may store code and/or data for operating the processor 310, and/or may store data processed by the processor 310. The memory unit 320 may include a nonvolatile memory device that includes a variable resistance device according to one of the example embodiments described above.

The interface unit 340 may be used as a path, in which the electronic system 300 exchanges data with an external device (not shown). The processor 310, the memory unit 330, the I/O device 330, and the interface unit 340 may communicate with one another via a bus 350.

For example, the electronic system 300 may be employed in a mobile phone, an MP3 player, a navigation device, a portable multimedia player (PMP), a solid state drive (SSD), or household appliances.

As described above, according to one or more of the above example embodiments, a set current of a variable resistance device included in a semiconductor device is determined based on a distribution of the reset current, i.e. a distribution of an off resistance of the variable resistance device, thereby improving the distribution of an 'off' current of the variable resistance device, and accordingly improving the reliability of the semiconductor device including the variable resistance device.

According to one or more of the above example embodiments, an overshoot or an undershoot that may occur when the variable resistance device include in the semiconductor device is switched from an "off" state to an "on" state is reduced, thereby improving the durability of the semiconductor device.

Descriptions of features or aspects within each example embodiment should typically be considered as available for other similar features or aspects in other example embodiments. While some example embodiments have been particularly shown and described, it will be understood by one of ordinary skill in the art that variations in form and detail may be made therein without departing from the spirit and scope of the claims.

What is claimed is:

1. A variable resistance device comprising:
a first electrode and a second electrode;
a variable resistance material layer between the first and second electrodes; and
a control circuit operatively connected to the variable resistance material layer,
the control circuit being configured to change a resistance value of the variable resistance material layer from a first resistance value to a second resistance value greater than the first resistance value by causing the application of a first voltage between the first and second electrodes,
the control circuit being configured to change the resistance value of the variable resistance material layer from the second resistance value to the first resistance value by causing the application of a second voltage between the first and second electrodes, and
the control circuit being configured to determine the second voltage based on a distribution of a first current flowing through the variable resistance device.

2. The variable resistance device of claim 1, wherein
the control circuit is configured to change the second voltage if a difference between a sensed level of the first current and an average level of the first current is greater than a first threshold amount; and
the control circuit is configured to maintain the second voltage if the difference between a sensed level of the first current and the average level of the first current is smaller than or equal to the first threshold amount.

3. The variable resistance device of claim 1, wherein
the control circuit is configured to change the second voltage if the sensed level of the first current and the average level of the first current are different from each other; and
the control circuit is configured to maintain the second voltage if the sensed level of the first current and the average level of the first current are the same.

4. A semiconductor device comprising:
a variable resistance device including,
a first electrode and a second electrode, and
a variable resistance material layer between the first and second electrodes, and
a control circuit operatively connected to the variable resistance material layer,
the control circuit being configured to change a resistance value of the variable resistance material layer from a first resistance value to a second resistance value that is greater than the first resistance value by causing the application of a first voltage between the first and second electrodes,
the control circuit being configured to change the resistance value of the variable resistance material layer from the second resistance value to the first resistance value by causing the application of a second voltage between the first and second electrodes, and
the control circuit being configured to determine the second voltage based on a distribution of a first current flowing through the variable resistance device.

5. The semiconductor device of claim 4, wherein
the control circuit is configured to change the second voltage if a difference between a sensed level of the first current and the average level of the first current is greater than a first threshold amount; and
the control circuit is configured to maintain the second voltage if the difference between a sensed level of the first current and the average level of the first current is smaller than or equal to the first threshold amount.

6. The semiconductor device of claim 4, wherein
the control circuit is configured to change the second voltage if the sensed level of the first current and the average level of the first current are different from each other; and
the control circuit is configured to maintain the second voltage if the sensed level of the first current and the average level of the first current are the same.

7. The semiconductor device of claim 4, wherein the variable resistance material layer includes one of a perovskite material and a transition metal oxide.

8. A memory card comprising:
the semiconductor device of claim 4; and
a controller operatively connected to the semiconductor device.

9. An electronic system comprising:
the semiconductor device of claim 4;
a processor; and
a bus that operatively connects the semiconductor device to the processor.

10. A method of operating a semiconductor device including a variable resistance device, comprising:
applying a first voltage to the variable resistance device to change a resistance value of the variable resistance device from a first resistance value to a second resistance value,
the second resistance value being different from the first resistance value;
sensing a first current flowing through the variable resistance device to which the first voltage is applied;
determining a second voltage used to change the resistance value of the variable resistance device from the second resistance value to the first resistance value based on a distribution of the sensed first current; and
applying the second voltage to the variable resistance device.

11. The method of claim 10, wherein
the second resistance value is greater than the first resistance value.

12. The method of claim 10, wherein the determining of the second voltage comprises:
comparing the distribution of the first current with an average level of the first current.

13. The method of claim 12, wherein the determining of the second voltage further comprises:
changing the second voltage if a difference between a sensed level of the first current and the average level of the first current is greater than a first threshold amount; and
maintaining the second voltage if the difference between a sensed level of the first current and the average level of the first current is smaller than or equal to the first threshold amount.

14. The method of claim 13, wherein the changing of the second voltage comprises:
changing the second voltage to a third voltage that is greater than the second voltage if the sensed level of the first current is smaller than the average level of the first current; and
changing the second voltage to a fourth voltage that is smaller than the second voltage if the sensed level of the first current is greater than the average level of the first current.

15. The method of claim 13, wherein the changing of the second voltage comprises:
changing at least one of a magnitude and a pulse width of the second voltage.

16. The method of claim 12, wherein the determining of the second voltage further comprises:
changing the second voltage if the sensed level of the first current is different from the average level of the first current; and
maintaining the second voltage if the sensed level of the first current is equal to the average level of the first current.

17. The method of claim 16, wherein the changing of the second voltage comprises:
changing the second voltage to the third voltage that is greater than the second voltage if the sensed level of the first current is smaller than the average level of the first current; and
changing the second voltage to the fourth voltage that is smaller than the second voltage if the sensed level of the first current is greater than the average level of the first current.

18. The method of claim 16, wherein the changing of the second voltage comprises:
changing at least one of the magnitude and the pulse width of the second voltage.

19. The method of claim 10, wherein the determining of the second voltage further comprises:
determining the second voltage so that the greater the distribution of the first current, the greater the variation of the second voltage.

20. The method of claim 10, wherein the sensing of the first current comprises:
sensing the first current flowing through the variable resistance device to which the first voltage is applied by applying a read voltage having an absolute value smaller than that of the first voltage.

21. The method of claim 10, further comprising:
sensing a second current flowing through the variable resistance device to which the second voltage is applied.

22. The method of claim 21, wherein the sensing of the second current comprises:
sensing the second current flowing through the variable resistance device to which the second voltage is applied by applying a read voltage having an absolute value smaller than an absolute value of the second voltage.

23. The method of claim 20, wherein
the semiconductor device includes a multi-bit non-volatile memory device.

24. The method of claim 10, wherein
the first resistance is a set resistance, and
the second resistance is a reset resistance.

25. The method of claim 10, wherein the variable resistance device includes:
a variable resistance material layer including one of a perovskite material and a transition metal oxide.

26. The method of claim 10, wherein the variable resistance device includes:
a lower electrode;
an upper electrode; and
a variable resistance material layer between the lower electrode and the upper electrode.

27. The method of claim 26, wherein
at least one of the lower electrode and the upper electrode includes one of an oxidation resistance metal layer and a polysilicon layer.

28. The method of claim 10, wherein
the first voltage is a reset voltage for changing the variable resistance device to a high resistance state, and
the second voltage is a set voltage for changing the variable resistance device a low resistance state.

29. The method of claim 27, wherein the reset voltage is about 4.5 V.

30. The method of claim 10, wherein the semiconductor device includes a single-bit non-volatile memory device.

* * * * *